United States Patent [19]
Baker et al.

[11] Patent Number: 5,828,624
[45] Date of Patent: Oct. 27, 1998

[54] DECODER CIRCUIT AND METHOD FOR DISABLING A NUMBER OF COLUMNS OR ROWS IN A MEMORY

[75] Inventors: William G. Baker, Starkville, Miss.; Andrew L. Hawkins, Santa Clara, Calif.; Jeffery Scott Hunt, Ackerman, Miss.

[73] Assignee: Cypress Semiconductor Corporation, San Jose, Calif.

[21] Appl. No.: 772,497

[22] Filed: Dec. 23, 1996

[51] Int. Cl.⁶ .................................................. G11C 8/00
[52] U.S. Cl. .............................. 365/230.06; 365/225.7; 365/200
[58] Field of Search .............................. 365/230.06, 200, 365/225.7

[56] References Cited

U.S. PATENT DOCUMENTS

| | | | |
|---|---|---|---|
| 5,530,674 | 6/1996 | McClure et al. | 365/201 |
| 5,548,555 | 8/1996 | Lee et al. | 365/200 |
| 5,590,085 | 12/1996 | Yuh et al. | 365/230.03 |
| 5,612,918 | 3/1997 | McClure | 365/200 |
| 5,621,691 | 4/1997 | Park | 365/200 |

*Primary Examiner*—David C. Nelms
*Assistant Examiner*—Hien Nguyen
*Attorney, Agent, or Firm*—Bliss McGlynn, P.C.

[57] ABSTRACT

The present invention concerns a method and apparatus for disabling columns using a local fuse decoding system. The present invention uses local decoding in order to use a number of fuses that is less than the number of columns in order to disable column failures. This is particularly useful when the fuse pitch is greater than the column pitch which does not allow for a fuse to be implemented in each column.

20 Claims, 3 Drawing Sheets

5,828,624

DECODER CIRCUIT AND METHOD FOR DISABLING A NUMBER OF COLUMNS OR ROWS IN A MEMORY

FIELD OF THE INVENTION

The present invention relates to column redundancy generally and, more particularly, to a local fuse decoding system for disabling defective columns of a memory array.

BACKGROUND OF THE INVENTION

Previous approaches for repairing column failures in a memory array typically required a fuse for each column to be disabled. FIG. 1 illustrates a circuit 10 for disabling a defective column using a fuse. The circuit 10 generally comprises an AND gate 12, a fuse 14, a transistor 16, a transistor 18, a transistor 20 and a set of bitlines 22a and 22b. When the fuse 14 is intact, or not blown, the bitlines 22a and 22b are generally functional. The bitlines 22a and 22b are generally connected to the transistors 16 and 18. Signals from a number of T-bus switches (shown generally implemented as transistors 16 and 18) are generally shown as signals TBUS and TBUSB. A signal EN and a signal COLSEL are generally presented to the AND gate 12. The transistors 16 and 18 are generally activated if the signal EN and the signal COLSEL are asserted. The AND gate 12 and the transistor 20 are generally sized such that the AND gate 12 overpowers the transistor 20 in order to keep the transistors 16 and 18 on. If the bitlines 22a and 22b are not functional, the fuse 14 is generally blown and the transistor 20 keeps the transistors 16 and 18 in a generally continuously off condition.

While the circuit 10 may perform the function of disabling a particular column, it generally requires a single fuse for each column. Additionally, the column pitch of the memory cell must be wider than or equal to the fuse pitch to allow the placement of the fuse 14 at each column. If it is desired to implement the column disabling feature while using fewer fuses, the previous approach becomes impractical.

SUMMARY OF THE INVENTION

The present invention concerns a method and apparatus for disabling columns using a local fuse decoding system. The present invention uses local decoding in order to use a number of fuses that is less than the number of columns in order to disable column failures. This is particularly useful when the fuse pitch is greater than the column pitch which does not allow for a fuse to be implemented in each column.

The objects, features and advantages of the present invention include providing a fuse decoding system to implement column disabling while using less fuses than columns.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
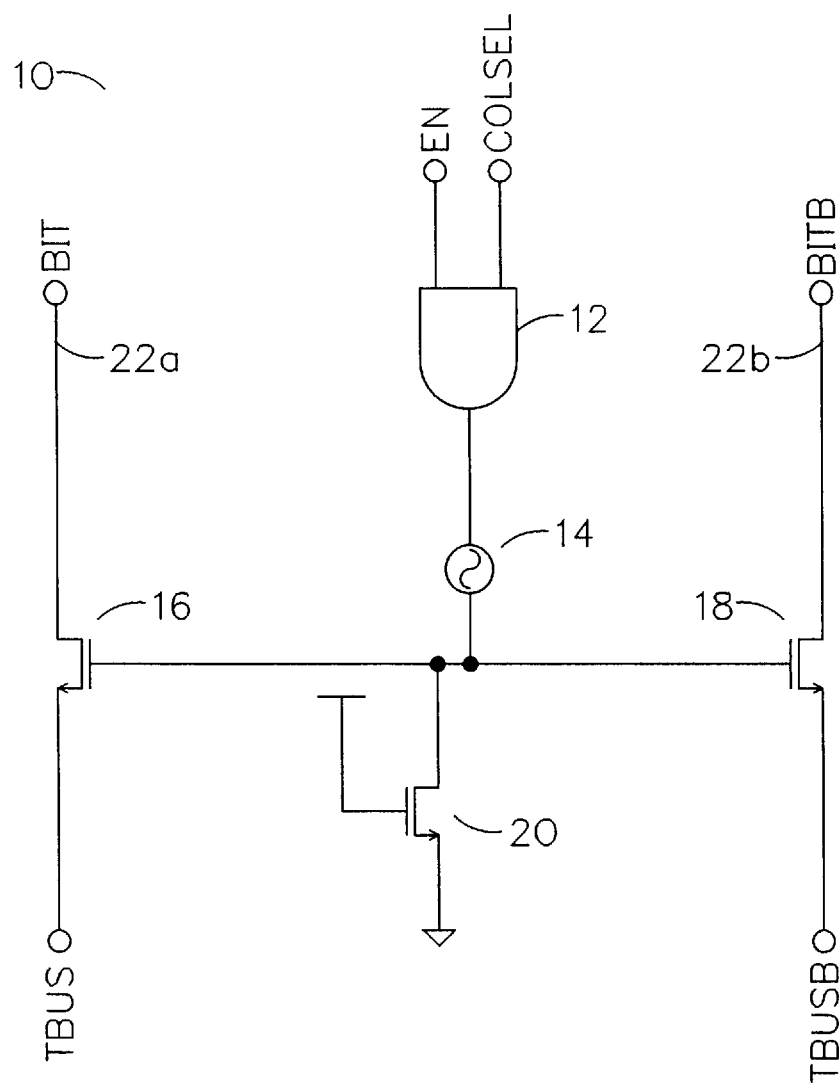
FIG. 1 is a circuit diagram of a previous approach implementing a single fuse per column.
Figure 2:
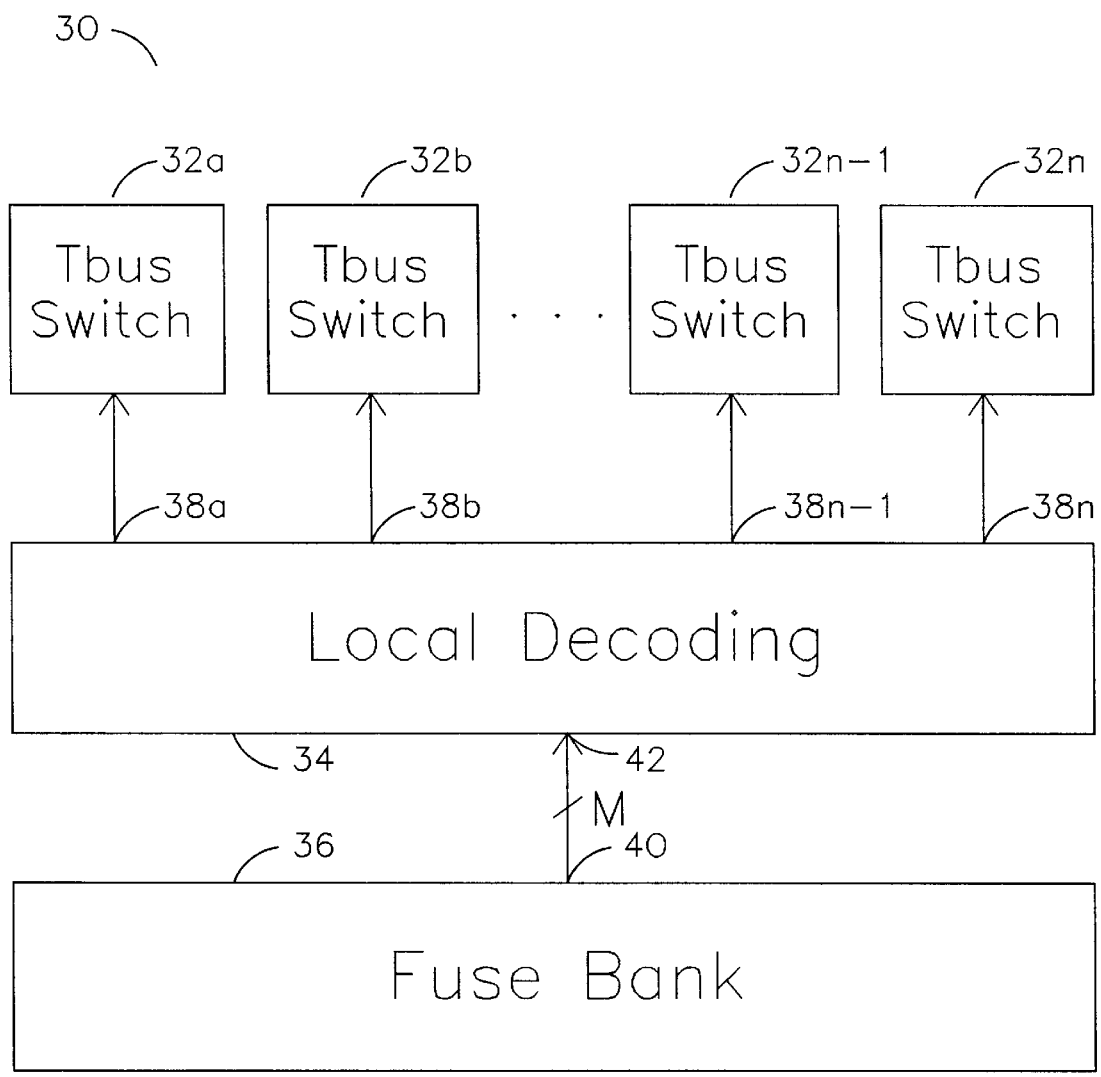
FIG. 2 is a block diagram of a preferred embodiment of the present invention.

Referring to FIG. 2, a block diagram of a circuit 30 is shown in accordance with a preferred embodiment of the present invention. A circuit 30 generally comprises a number of T-bus switches 32a~32n, a local decoding block 34 and a fuse bank 36. The local decode block 34 generally presents a number of outputs 38a~38n that generally present N-number of control signals to the T-bus switches 32a~32n. The fuse bank 36 generally presents an M-bit signal at an output 40 that is generally received at an input 42 of the local decode circuitry 34.

In an example where eight independent states are required to be decoded, three fuses will generally be required. Generally, N fuses may be employed to generate up to $2^N$ states. Each of the states may be used to disable a particular column. More than one column may be disabled for a given state. Additionally, a particular state may be set to a "don't care" condition where no columns are disabled. The following TABLE 1 illustrates one such implementation:

TABLE 1

| F0 | F1 | F2 | E0 | E1 | E2 | E3 | Comments |
|----|----|----|----|----|----|----|----------|
| 1 | 1 | 1 | 0 | 0 | 0 | 0 | Enable All Columns |
| 0 | 0 | 0 | 1 | 0 | 0 | 0 | Disable Column 0 |
| 0 | 0 | 1 | 0 | 1 | 0 | 0 | Disabie Column 1 |
| 0 | 1 | 0 | 0 | 0 | 1 | 0 | Disable Column 2 |
| 0 | 1 | 1 | 0 | 0 | 0 | 1 | Disable Column 3 |
| 1 | 0 | 0 | 1 | 1 | 0 | 0 | Disable Columns 0&1 |
| 1 | 0 | 1 | 0 | 1 | 1 | 0 | Disable Columns 1&2 |
| 1 | 1 | 0 | 0 | 0 | 1 | 1 | Disable Columns 2&3 |

The fuses are indicated as F0, F1 and F2. The fuses implemented in the fuse bank 36 that may be used to decode eight independent states. In a more preferred embodiment, the state of a fuse refers to whether the fuse is intact (enabled, for example a logical "1") or blown (disabled, for example a logical "0"). The eight independent states are generally shown by combinations of the signals E0, E1, E2 and E3. In the case of three fuses and eight independent states, the M-bit bus will be a 3-bit bus where each of the bits is represented by one of the signals F0, F1 and F2. In the first row, each of the signals F0, F1 and F2 are in a high state, or a "1", which decodes a "0" to each of the signals E0~E3. The last column in TABLE 1 (indicated generally as COMMENTS) shows an example of a particular state of column disabling that may be implemented. The particular example shows the first state, where each of the fuses are intact, as indicating that all of the columns are enabled. As a result, without programming any of the fuses F0~F2, each of the columns will generally be enabled, which may provide a general presumption that all of the columns are functioning properly. The states shown in rows 2, 3, 4 and 5 indicate a disabling of column 0, column 1, column 2 and column 3, respectively. This generally provides the ability to individually disable any one of the particular columns 0~3. The rows 6, 7 and 8 indicate a disabling of columns 0 and 1, columns 1 and 2, and columns 2 and 3, respectively. As a result, the ability to disable multiple adjacent columns is generally provided. The columns may be in an active state (generally indicating data is being transferred), an inactive state (generally indicating data is not being transferred) or a disable state (generally indicating the column is removed from the array).

The statistical probability of two single column failures that are not adjacent occurring within the columns being decoded is generally low. As a result, the present invention provides the ability to disable adjacent columns as shown as states 6, 7 and 8. While the states 2~5 show the disabling of the particular columns and state 1 shows the disabling of no columns, other combinations may be substituted for any of the states to disable particular columns if a particular statistical significance is recognized. Specifically, the particular columns that are disabled that are shown in the column COMMENTS, may be user programmed in order to compensate for known manufacturing techniques and problems. The larger the size of the block, the more likely that two independent non-adjacent column failures may occur. Particular non-adjacent columns may be disabled according to the design criteria of a particular application.

The following TABLE 2 illustrates an example where four fuses F0, F1, F2 and F3 are used to decode 16 independent states which may be represented by signals E0, E1, E2, E3, E4, E5, E6 and E7.

fuses, when in this particular state, do not disable any columns. This may be an advantage in certain design applications. Additionally, an individual column or more than one individual column may, for certain design constraints, have an individual fuse. As a result, using a smaller number of fuses to decode the disabling of a larger number of columns may be used for particular columns, while the conventional one fuse to one column may be used for additional columns.

Figure 3:
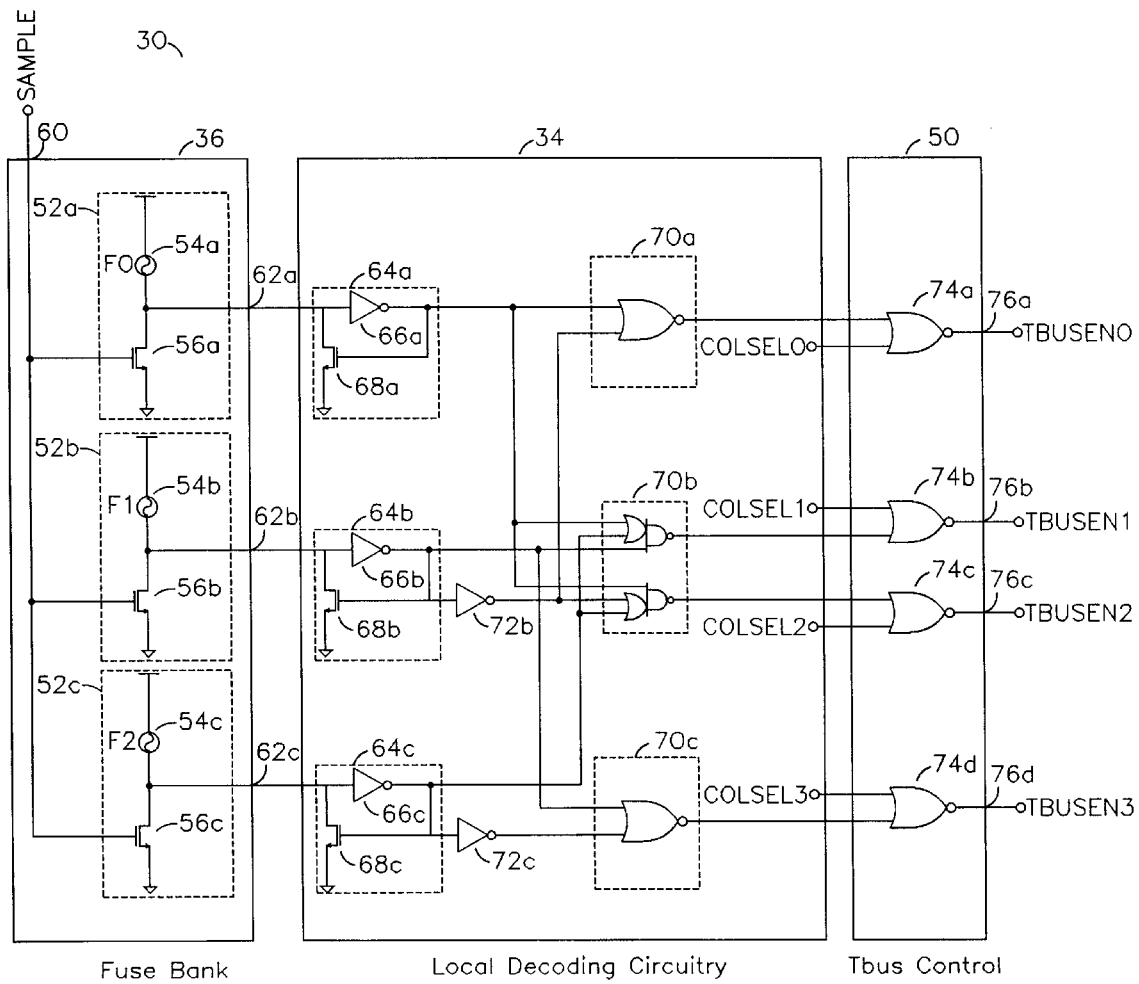
FIG. 3 is a circuit diagram of a preferred embodiment of the present invention.

Referring to FIG. 3, a diagram of the circuit 30 is shown. The circuit 30 generally comprises the local decoding block 34, the fuse bank 36 and a T-bus control block 50. The fuse bank 36 is shown comprising a number of fuse blocks 52a~52c. The fuse block 52a is shown comprising a fuse

TABLE 2

| F0 | F1 | F2 | F3 | E0 | E1 | E2 | E3 | E4 | E5 | E6 | E7 | Comments |
|----|----|----|----|----|----|----|----|----|----|----|----|----------|
| 1 | 1 | 1 | 1 | 0 | 0 | 0 | 0 | 0 | 0 | 0 | 0 | Enable All Columns |
| 0 | 0 | 0 | 0 | 1 | 0 | 0 | 0 | 0 | 0 | 0 | 0 | Disable Column 0 |
| 0 | 0 | 0 | 1 | 0 | 1 | 0 | 0 | 0 | 0 | 0 | 0 | Disable Column 1 |
| 0 | 0 | 1 | 0 | 0 | 0 | 1 | 0 | 0 | 0 | 0 | 0 | Disable Column 2 |
| 0 | 0 | 1 | 1 | 0 | 0 | 0 | 1 | 0 | 0 | 0 | 0 | Disable Column 3 |
| 0 | 1 | 0 | 0 | 0 | 0 | 0 | 0 | 1 | 0 | 0 | 0 | Disable Column 4 |
| 0 | 1 | 0 | 1 | 0 | 0 | 0 | 0 | 0 | 1 | 0 | 0 | Disable Column 5 |
| 0 | 1 | 1 | 0 | 0 | 0 | 0 | 0 | 0 | 0 | 1 | 0 | Disable Column 6 |
| 0 | 1 | 1 | 1 | 0 | 0 | 0 | 0 | 0 | 0 | 0 | 1 | Disable Column 7 |
| 1 | 0 | 0 | 0 | 1 | 1 | 0 | 0 | 0 | 0 | 0 | 0 | Disable Columns 0&1 |
| 1 | 0 | 0 | 1 | 0 | 1 | 1 | 0 | 0 | 0 | 0 | 0 | Disable Columns 1&2 |
| 1 | 0 | 1 | 0 | 0 | 0 | 1 | 1 | 0 | 0 | 0 | 0 | Disable Columns 2&3 |
| 1 | 0 | 1 | 1 | 0 | 0 | 0 | 1 | 1 | 0 | 0 | 0 | Disable Columns 3&4 |
| 1 | 1 | 0 | 0 | 0 | 0 | 0 | 0 | 1 | 1 | 0 | 0 | Disable Columns 4&5 |
| 1 | 1 | 0 | 1 | 0 | 0 | 0 | 0 | 0 | 1 | 1 | 0 | Disable Columns 5&6 |
| 1 | 1 | 1 | 0 | 0 | 0 | 0 | 0 | 0 | 0 | 1 | 1 | Disable Columns 6&7 |

The signals F0~F3 are used to decode the 16 independent states. Similar to the example shown in TABLE a, the first state generally enables all the columns. The second through ninth states generally disable independent columns. The tenth through sixteenth states generally disable adjacent columns 0 and 1, columns 1 and 2, columns 2 and 3, columns 3 and 4, columns 4 and 5, columns 5 and 6 and columns 6 and 7.

An example where each of the decoded states are not specifically used is shown in the following TABLE 3:

54a and a control transistor 56a. The fuse blocks 52b and 52c have similar fuses 54b~54c and control transistors 56b~56c. The fuse blocks 52a~52c may be implemented as fuses, anti-fuses, via lines or any type of fuse necessary to meet the design criteria of a particular application. A signal SAMPLE is generally received at an input 60 of the fuse bank 36. The fuse bank 36 generally presents a number of outputs 62a, 62b and 62c that generally represent the M-bit signal presented at the output 40 shown in FIG. 2.

The local decoding block 34 generally receives the signals presented at the outputs 62a~62c. A number of blocks

TABLE 3

| F0 | F1 | F2 | F3 | E0 | E1 | E2 | E3 | E4 | E5 | E6 | E7 | Comments |
|----|----|----|----|----|----|----|----|----|----|----|----|----------|
| 1 | 1 | 1 | 1 | 0 | 0 | 0 | 0 | 0 | 0 | 0 | 0 | Enable All Columns |
| 0 | 0 | 0 | 0 | 1 | 0 | 0 | 0 | 0 | 0 | 0 | 0 | Disable Column 0 |
| 0 | 0 | 0 | 1 | 0 | 1 | 0 | 0 | 0 | 0 | 0 | 0 | Disable Column 1 |
| 0 | 0 | 1 | 0 | 0 | 0 | 1 | 0 | 0 | 0 | 0 | 0 | Disable Column 2 |
| 0 | 0 | 1 | 1 | 0 | 0 | 0 | 1 | 0 | 0 | 0 | 0 | Disable Column 3 |
| 0 | 1 | 0 | 0 | 0 | 0 | 0 | 0 | 1 | 0 | 0 | 0 | Disable Column 4 |
| 0 | 1 | 0 | 1 | 0 | 0 | 0 | 0 | 0 | 1 | 0 | 0 | Disable Column 5 |
| 0 | 1 | 1 | 0 | 0 | 0 | 0 | 0 | 0 | 0 | 1 | 0 | Disable Column 6 |
| 0 | 1 | 1 | 1 | 0 | 0 | 0 | 0 | 0 | 0 | 0 | 1 | Disable Column 7 |
| 1 | 0 | 0 | 0 | 1 | 1 | 0 | 0 | 0 | 0 | 0 | 0 | Disable Columns 0&1 |
| 1 | 0 | 0 | 1 | 0 | 1 | 1 | 0 | 0 | 0 | 0 | 0 | Disable Columns 1&2 |
| 1 | 0 | 1 | 0 | 0 | 0 | 1 | 1 | 0 | 0 | 0 | 0 | Disable Columns 2&3 |
| 1 | 0 | 1 | 1 | 0 | 0 | 0 | 1 | 1 | 0 | 0 | 0 | Disable Columns 3&4 |
| 1 | 1 | 0 | 0 | 0 | 0 | 0 | 0 | 0 | 0 | 0 | 0 | Don't Care |
| 1 | 1 | 0 | 1 | 0 | 0 | 0 | 0 | 0 | 0 | 0 | 0 | Don't Care |
| 1 | 1 | 1 | 0 | 0 | 0 | 0 | 0 | 0 | 0 | 0 | 0 | Don't Care |

The bottom three states, which were shown in TABLE 2 and used to disable particular groups of columns, are changed to "don't care" conditions. This means that the 64a~64c generally receive the signals from the fuse bank 36. The block 64a is shown generally comprising an inverter 66a and a control transistor 68a. The signal received from the output 62a is generally presented to the inverter 66a as well as to a drain of the transistor 68a. The gate of the transistor 68a generally receives a signal from the output at the inverter 66a. The output of the inverter 66a generally presents a signal F0B to a gate 70a. The blocks 64b and 64c are generally configured similarly to the block 64a. The block 64b generally presents a signal F1B as well as a signal F1. The signal F1 is generally presented through an inverter 72b from the block 64b. Similarly a signal F2 is generally presented through an inverter 72c from the block 64c. A logic gate 70b generally receives the signal F0B, the signal F1B, the signal F1 and the signal F2B. The gate 70c generally receives the signal F2 and the signal F1B. The gate 70a generally receives the signal F0B and the signal F1. The gate 70a generally presents the signal E0. The gate 70b generally presents the signals E1 and E2. The gate 70c generally presents the signal E3. The gate 70b is shown having a number of gates to present the desired output signals E1 and E2.

The local decoding circuitry 34 is shown as an example for decoding three fuses to control four columns as specified in the comments shown in TABLE 1. The particular columns or groups of columns that are disabled may be adjusted to fit the design criteria of a particular application. However, if the particular columns to be disabled are changed from the columns specified in the comments of TABLE 1, the local decoding circuitry 34 would have to be adjusted appropriately. However, the specific decode circuitry, even for the example shown in TABLE 1, may be implemented differently provided it produces the desired output effects for the signals E0~E3.

The T-bus control block 50 generally receives the signal E0 at a gate 74a, the signal E1 at a gate 74b, the signal E2 at a gate 74c and the signal E3 at a gate 74d. The gate 74a may also receive a signal COLSEL0. The gate 74b may also receive a signal COLSEL1. The gate 74c may also receive a signal COLSEL2. The gate 74d may also receive a signal COLSEL3. The T-bus control block 50 has an output 76a that generally presents a signal TBUSEN0, an output 76b that generally presents a signal TBUSEN1, an output 76c that generally presents a signal TBUSEN2 and an output 76d that generally presents a signal TBUSEN3. The gates 74a~74d use the signals E0~E3 in combination with the signals COLSEL0~3 to produce the signals TBUSEN0~3.

Multiple instances of the fuse bank 36 and the decoding block 34 may be implemented on a single chip to meet the design criteria of a particular application. The additional circuitry may be used to provide additional control of particular columns to be disabled under certain conditions.

One aspect of the invention concerns a scheme used to generally implement circuitry to compensate for failures after a prediction as to where particular problems would occur has been made. The circuit 30 may allow for the ability to adapt to particular production issues. Specifically, there may be a case where the columns in the center of an array are rarely defective. In such a case it may be advantageous to have a triple row disable selection at either end of the array, particularly in a large array. This prediction can be extended to meet any design application. In the particular example shown in TABLE 3, the single column disabling, the combinations of the double column disabling and the no column disabling works out to be $2^4$, or sixteen, independent states.

The examples shown for the local decoding circuitry 34 may be adjusted to fit the design criteria of a particular application. The present invention may be used to disable the bitline loads to reduce the overall current consumption by replacing the fusing system shown in FIG. 2 of co-pending application entitled "CIRCUIT AND METHOD FOR DISABLING A BITLINE LOAD", filed on Nov. 1, 1996 (Ser. No. 08/742,449), the appropriate sections which are incorporated by reference. Additionally, the present invention may be used to disable defective rows in a row redundancy configuration.

While the invention has been particularly shown and described with reference to the preferred embodiments thereof, it will be understood by those skilled in the art that various changes in form and details may be made without departing from the spirit and scope of the invention.

We claim:

1. A circuit for disabling or enabling a number of columns in a memory array comprising:

a number of fuses, said number being at least one;

a decode circuit having a number of inputs corresponding to the number of fuses, said decode circuit generating a plurality of control signals in response to said number of fuses; and a plurality of gates, each receiving one of said plurality of control signals and disabling or enabling at least one column in said memory array in response to said one of said plurality of control signals.

2. The circuit according to claim 1 wherein the number of said control signals is greater than the number of said fuses.

3. The circuit according to claim 1, wherein each of said control signals disables or enables a particular column.

4. The circuit according to claim 1 wherein said fuses disable or enable at least two columns.

5. The circuit according to claim 1 wherein said number of fuses comprises at least three and said memory array comprises at least four columns, said decode circuit generates at least four control signals to control the disabling of said at least four columns.

6. The circuit according to claim 4 wherein said at least two columns are adjacent columns.

7. The circuit according to claim 6, comprising at least three fuses and at least four columns.

8. A circuit for disabling a number of columns or rows in a memory array comprising:

fuse means for generating an M-bit signal;

means for decoding said M-bit signal and generating a number of control signals; and means for disabling at least one column or at least one row in said memory array in response to said control signals.

9. The circuit according to claim 8 wherein said fuse means comprises a number of fuses, and the number of said control signals is greater than the number of said fuses.

10. The circuit according to claim 8 wherein said means for disabling comprises a gate that disables or enables a particular column.

11. The circuit according to claim 8 wherein said means for decoding generates at least one control signal that disables or enables two or more columns.

12. The circuit according to claim 8 further comprising disable control means configured to receive (a) at least one output of said means for disabling and (b) one or more select signals, to control said means for disabling.

13. The circuit according to claim 11 wherein said two or more columns are adjacent columns.

14. The circuit according to claim 11 wherein:

said fuse means comprises N independent fuses; and said means for decoding generates $2^N$ control signals.

15. A method for disabling or enabling at least two columns in a memory array, comprising the steps of:

generating a number of control signals in response to a state of at least one fuse; and decoding said number of control signals to generate at least one output signal, wherein said at least one output signal disables or enables said at least two columns.

16. The method according to claim 15 wherein said at least one fuse state is provided by a number of fuses, and the number of said control signals is greater than the number of fuses.

17. The method according to claim 15 further comprising the step of:

disabling said at least one column in response to said output signals.

18. The method according to claim 17 wherein said at least one column comprises at least two adjacent columns.

19. The method according to claim 15 further comprising the step of selecting at least one of said columns in response to (a) at least one of said output signals and (b) at least one independent select signal.

20. The method according to claim 15, wherein said number of fuses is at least three, said number of output signals is at least four, and said memory array comprises at least four columns.

* * * * *